(12) United States Patent
Pappritz et al.

(10) Patent No.: US 9,978,622 B2
(45) Date of Patent: May 22, 2018

(54) MOISTURE AND/OR ELECTRICALLY CONDUCTIVE REMAINS DETECTION FOR WAFERS AFTER RINSE / DRY PROCESS

(71) Applicant: GLOBALFOUNDRIES Inc., Grand Cayman (KY)

(72) Inventors: Thomas Pappritz, Konigzbruck (DE); Lutz Claussen, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 15/180,392

(22) Filed: Jun. 13, 2016

(65) Prior Publication Data

US 2016/0300744 A1   Oct. 13, 2016

Related U.S. Application Data

(62) Division of application No. 13/414,875, filed on Mar. 8, 2012, now Pat. No. 9,396,977.

(51) Int. Cl.
| | |
|---|---|
| *H01L 21/677* | (2006.01) |
| *H01L 21/67* | (2006.01) |
| *H01L 21/673* | (2006.01) |
| *H01L 21/66* | (2006.01) |

(52) U.S. Cl.
CPC .. *H01L 21/67271* (2013.01); *H01L 21/67028* (2013.01); *H01L 21/67063* (2013.01); *H01L 21/67288* (2013.01); *H01L 21/67316* (2013.01); *H01L 22/20* (2013.01)

(58) Field of Classification Search
CPC ......... H01L 21/67201; H01L 21/67772; H01L 21/67775
USPC ..................................... 414/217, 217.1, 940
See application file for complete search history.

(56) References Cited

U.S. PATENT DOCUMENTS

| | | | |
|---|---|---|---|
| 5,584,971 A | 12/1996 | Komino | |
| 7,084,466 B1 * | 8/2006 | Lee | ................... H01L 21/67288 257/414 |
| 2004/0221871 A1 | 11/2004 | Fletcher et al. | |

* cited by examiner

*Primary Examiner* — Saul Rodriguez
*Assistant Examiner* — Willie Berry, Jr.
(74) *Attorney, Agent, or Firm* — Ditthavong & Steiner, P.C.

(57) ABSTRACT

A method, device, and apparatus is provided for detecting moisture and/or electrically conductive remains on a wafer after the wafer is removed from a drying chamber of a processing tool that includes wet clean processing. Embodiments include fixing a wafer to an endeffector between a processing chamber and a FOUP, moving the wafer from the processing chamber toward the FOUP, detecting moisture and/or electrically conductive remains on the wafer, and delivering the wafer to the FOUP, if no moisture and/or electrically conductive remains are detected, or delivering the wafer to a buffer station, if moisture and/or electrically conductive remains are detected.

14 Claims, 6 Drawing Sheets

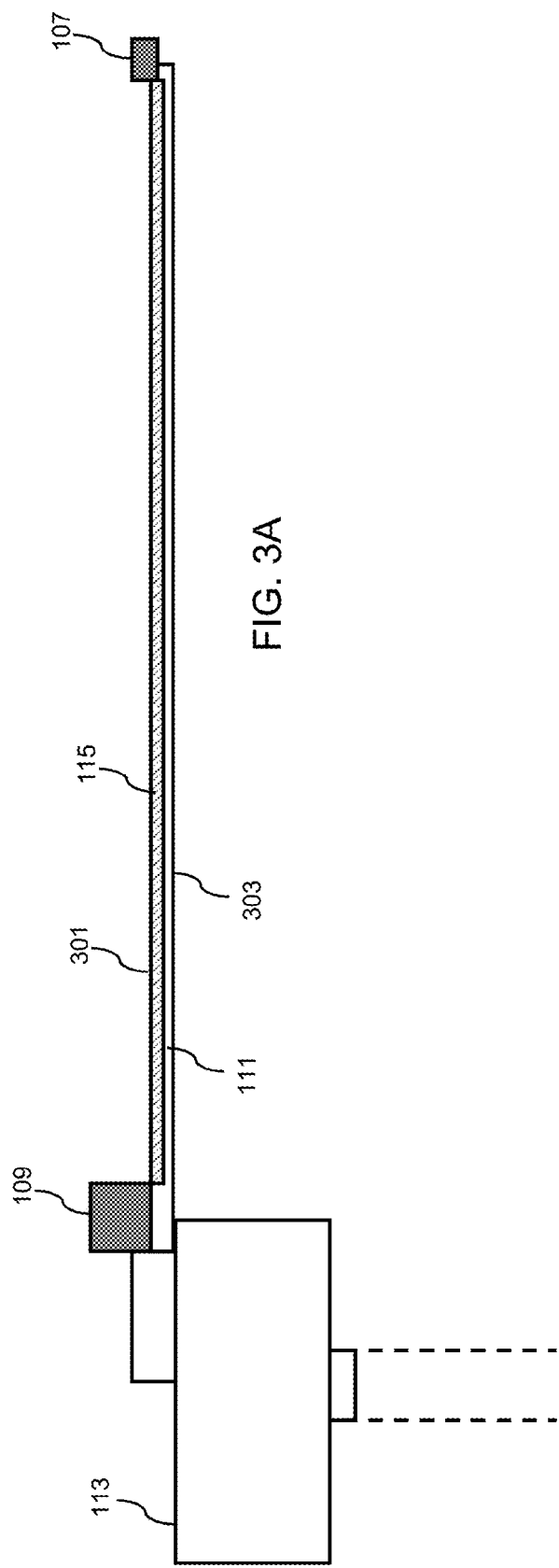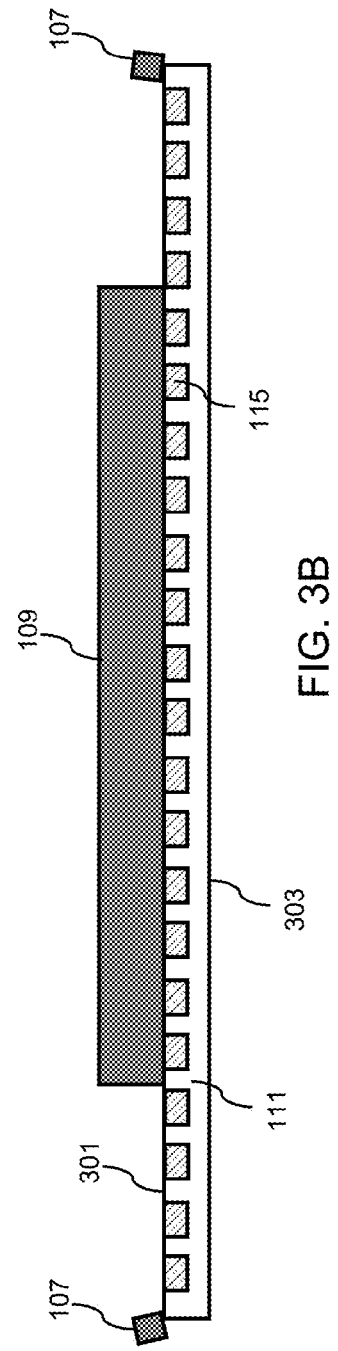

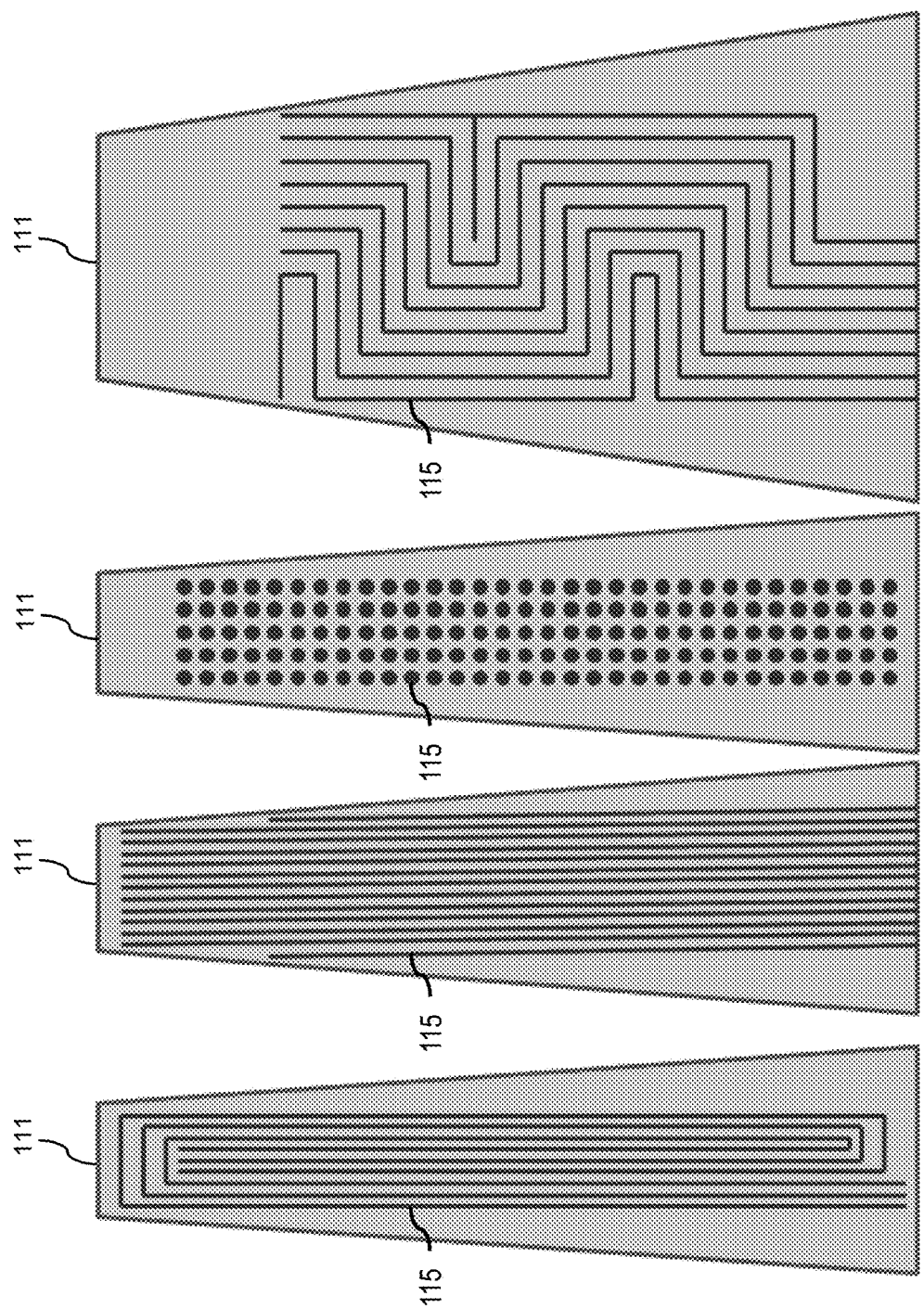

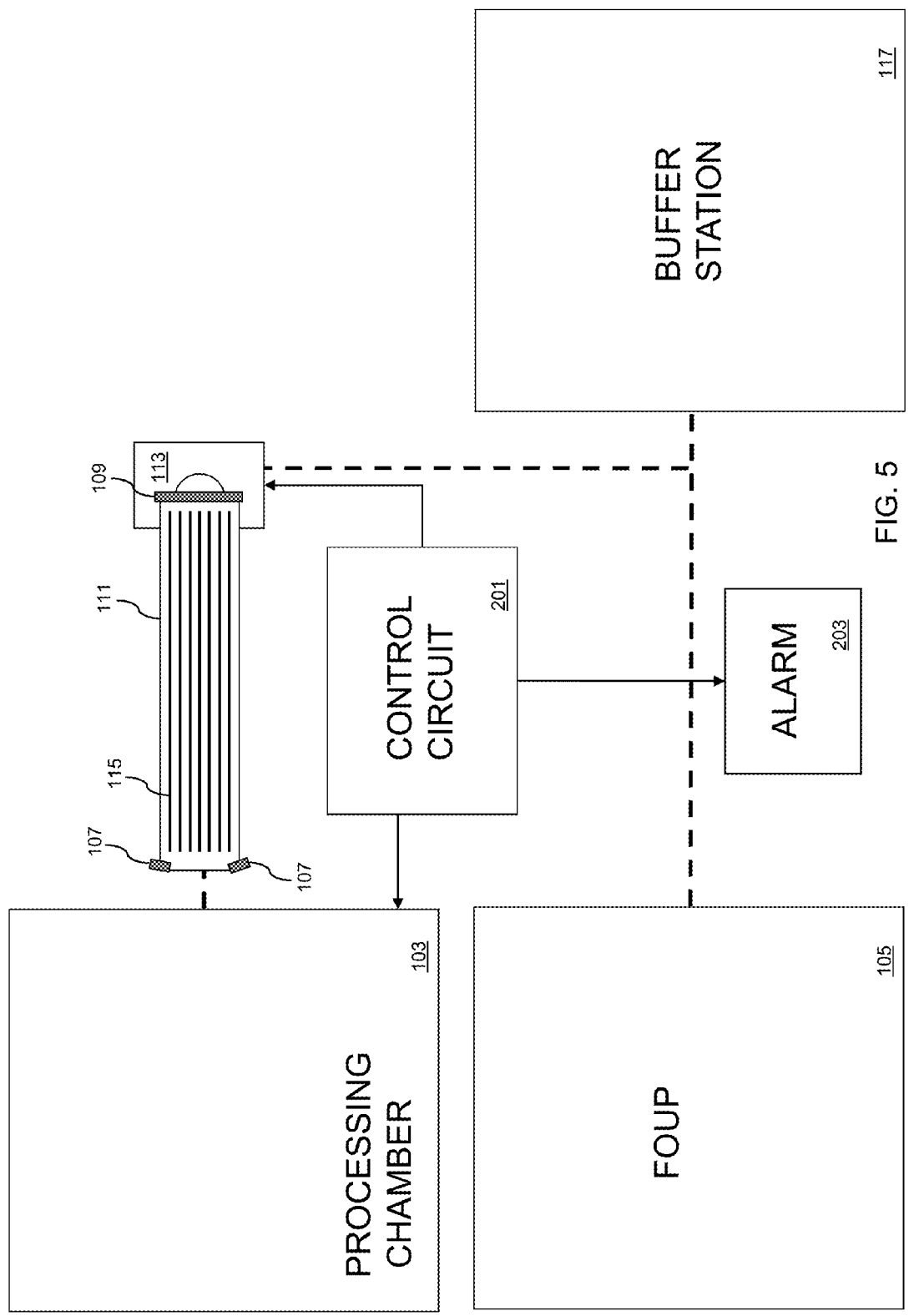

MOISTURE AND/OR ELECTRICALLY CONDUCTIVE REMAINS DETECTION FOR WAFERS AFTER RINSE / DRY PROCESS

RELATED APPLICATION

The present application is a Divisional of application Ser. No. 13/414,875, filed on Mar. 8, 2012, the disclosure of which is incorporated herein by reference in its entirety.

TECHNICAL FIELD

The present disclosure relates to wafer processing systems, and more particularly to detecting and handling moisture and/or electrically conductive remains on a wafer exiting the final processing chamber of a processing tool.

BACKGROUND

Wafer processing tools for wet platforms, e.g., chemical mechanical planarization (CMP), are based on the "dry-in/dry-out" principle although the majority of the processes are wet processes. Accordingly, the tools are designed to deliver dry wafers to a front opening unified pod (FOUP) from the last process chamber. However, a malfunction of the tool or a hardware failure may cause wet and/or contaminated wafers, e.g., with wet backsides, to be transferred to the FOUP. Wet, or otherwise contaminated, wafers in the FOUP can contaminate other wafers in the FOUP as well as wafer handling equipment in any subsequent processes. Current processes fail to detect this error.

A need therefore exists for methodology and apparatus enabling the detection of moisture and/or electrically conductive remains on wafers prior to delivery to the FOUP.

SUMMARY

An aspect of the present disclosure is a method for detecting moisture and/or electrically conductive material on a wafer fixed to an endeffector.

Another aspect of the present disclosure is a wafer handling endeffector including a moisture and/or electrically conductive material detector.

A further aspect of the present disclosure is an apparatus including a wafer handling endeffector including a moisture and/or electrically conductive material detector.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: fixing a wafer to an endeffector between a processing chamber and a FOUP; moving the wafer from the processing chamber toward the FOUP; detecting moisture and/or electrically conductive remains on the wafer; and delivering the wafer to the FOUP, if no moisture and/or electrically conductive remains are detected, or delivering the wafer to a buffer station, if moisture and/or electrically conductive remains are detected.

Aspects of the present disclosure include disabling the processing chamber, if moisture and/or electrically conductive remains are detected. Another aspect includes, the wafer being one wafer of a wafer lot, the wafer lot including at least one unprocessed wafer, and moving the at least one unprocessed wafer away from the processing chamber, if moisture and/or electrically conductive remains are detected on the wafer. Other aspects include initiating an acoustic and/or a visual alarm, if moisture and/or electrically conductive remains are detected on the wafer. Further aspects include detecting moisture and/or electrically conductive remains on the wafer by: providing metal structures on the endeffector; measuring resistance, capacitance, and/or inductance between the metal structures; and comparing the measured resistance, capacitance, and/or inductance to a resistance, capacitance, and/or inductance, respectively, of a corresponding wafer having no moisture and/or electrically conductive remains on the wafer. Additional aspects include measuring the resistance of the wafer by subjecting the metal structures of the endeffector to a pulsed or constant voltage. Further aspects include measuring the capacity and inductance of the wafer by employing a resonance circuit including the metal structures. More specifically, a reduction in the resistance, capacitance, and/or inductance of the wafer from the resistance, capacitance, and/or inductance, respectively, of the corresponding wafer indicates the presence of moisture and/or electrically conductive remains on the wafer. Another aspect includes inspecting the endeffector for the presence of moisture and/or electrically conductive remains, if moisture and/or electrically conductive remains are detected on the wafer.

Another aspect of the present disclosure is a device including: an endeffector having a first surface and a second surface, opposite the first surface, the endeffector including means for holding a wafer proximate to the first surface; metal structures on the first surface of the endeffector connected to a voltage source; and a resistance, capacity, and/or inductance sensor connected to the metal structures.

Aspects of the present disclosure include the metal structures being laminated to the first surface of the endeffector, embedded in the first surface of the endeffector, or sputtered, printed, or deposited on the first surface of the endeffector. Further aspects include the metal structures being resistant against sulfuric acid and chemical blends containing hydrogen peroxide. Additional aspects include the metal structures including gold, silver, platinum, titanium, or alloys thereof.

Another aspect of the present disclosure is an apparatus including: a wafer processing tool including a wafer processing chamber, e.g., a wafer drying chamber; a FOUP; an endeffector for transporting wafers, one at a time, between the processing chamber and the FOUP; a moisture and/or conductive remains detection device connected to the endeffector; a buffer station; and a circuit, connected to the moisture and/or conductive remains device, the endeffector, and the wafer processing chamber, the circuit being configured to disable the processing chamber and to instruct the endeffector to deliver a wafer thereon to the buffer station, if the moisture detection and/or conductive remains detection device detects moisture and/or conductive remains.

Further aspects include the endeffector having a first surface and a second surface opposite the first surface and including means for holding a wafer proximate to the first surface, and the moisture and/or conductive remains detection device including: metal structures on the first surface of the endeffector connected to a voltage source; and a resistance, capacity, and/or inductance sensor connected to the metal structures. Further aspects of the apparatus include an acoustic and/or visual alarm connected to the circuit, wherein the circuit is further configured to trigger the alarm if the moisture and/or conductive remains detection device detects moisture and/or electrically conductive remains.

Another aspect of the apparatus includes a wafer storage unit and a transport device for transporting wafers in the processing tool to the wafer storage device if the moisture and/or conductive remains detection device detects moisture and/or electrically conductive remains.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 3A and 3B schematically illustrate a side view and front view, respectively, of a device in accordance with an exemplary embodiment;

FIGS. 4A through 4D illustrate various embodiments of a moisture and/or electrically conductive remains detection device attached to an endeffector, in accordance with an exemplary embodiment; and FIG. 5 schematically illustrates an apparatus, in accordance with an exemplary embodiment of the present disclosure.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of moisture and/or electrically conductive residue remaining on a wafer upon removal from the processing tool and transfer into a FOUP, which can lead to the contamination of other wafers in the FOUP as well as wafer handling devices in subsequent processing. In accordance with embodiments of the present disclosure, a wafer handling endeffector includes a moisture and/or electrically conductive material detector which in turn is connected to a control circuit for sensing resistance, capacity, and/or inductance. As a result of sensing a change in resistance, capacity, and/or inductance, the control circuit may actuate an acoustic and/or visual alarm, direct the contaminated wafer to a storage area separate from the FOUP, disable one or more chambers of the processing tool, and/or direct unprocessed wafers to storage until processing is reinitiated.

Methodology in accordance with embodiments of the present disclosure includes fixing a wafer to an endeffector between a processing chamber and a FOUP, moving the wafer toward the FOUP, and detecting moisture and/or electrically conductive materials on the wafer. If no moisture and/or electrically conductive remains are detected on the wafer, the wafer is delivered to the FOUP. However, if moisture and/or electrically conductive remains are detected on the wafer, the wafer is delivered to a buffer station.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
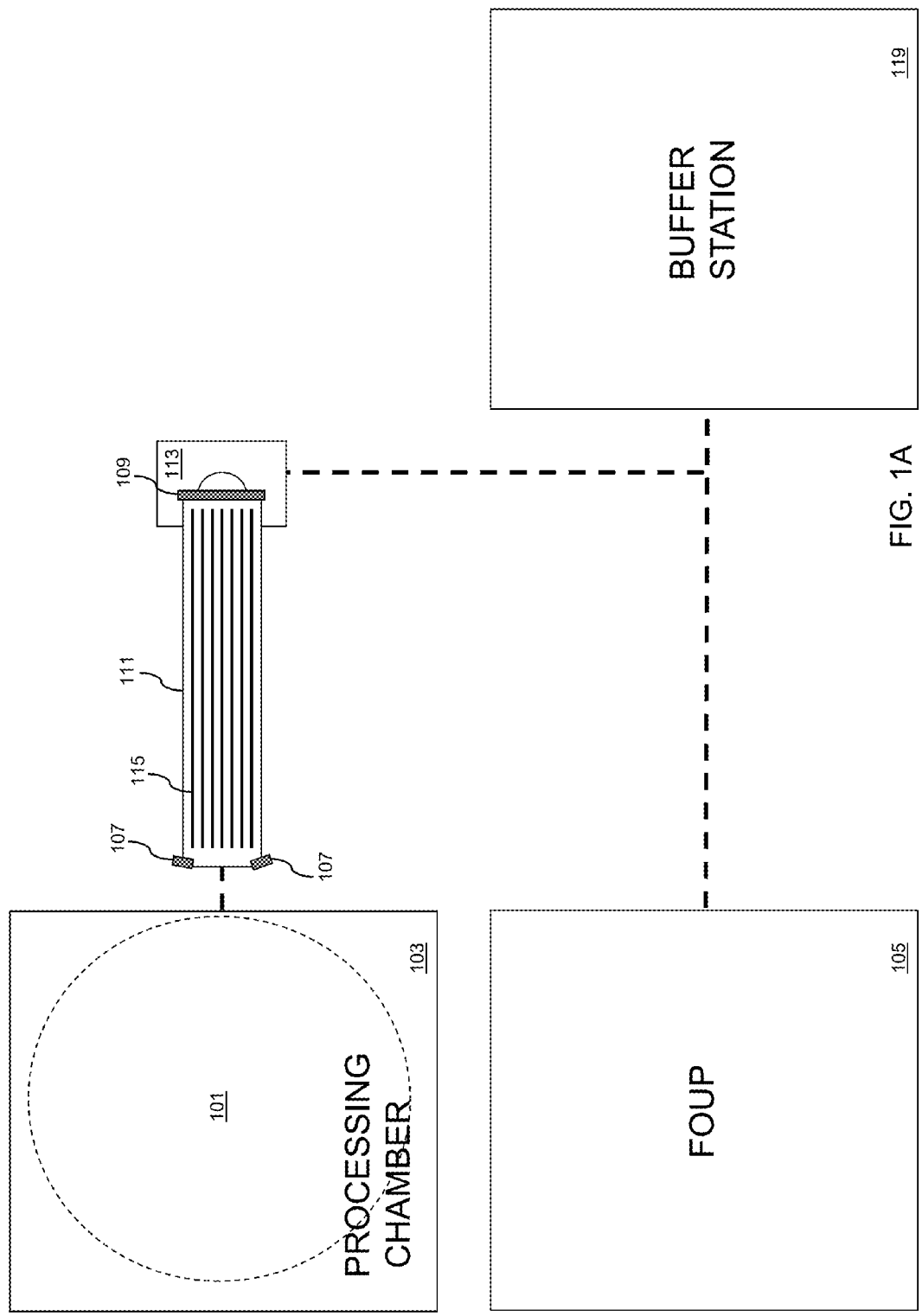
FIGS. 1A and 1B schematically illustrate a method, in accordance with an exemplary embodiment of the present disclosure.
Figure 1B:
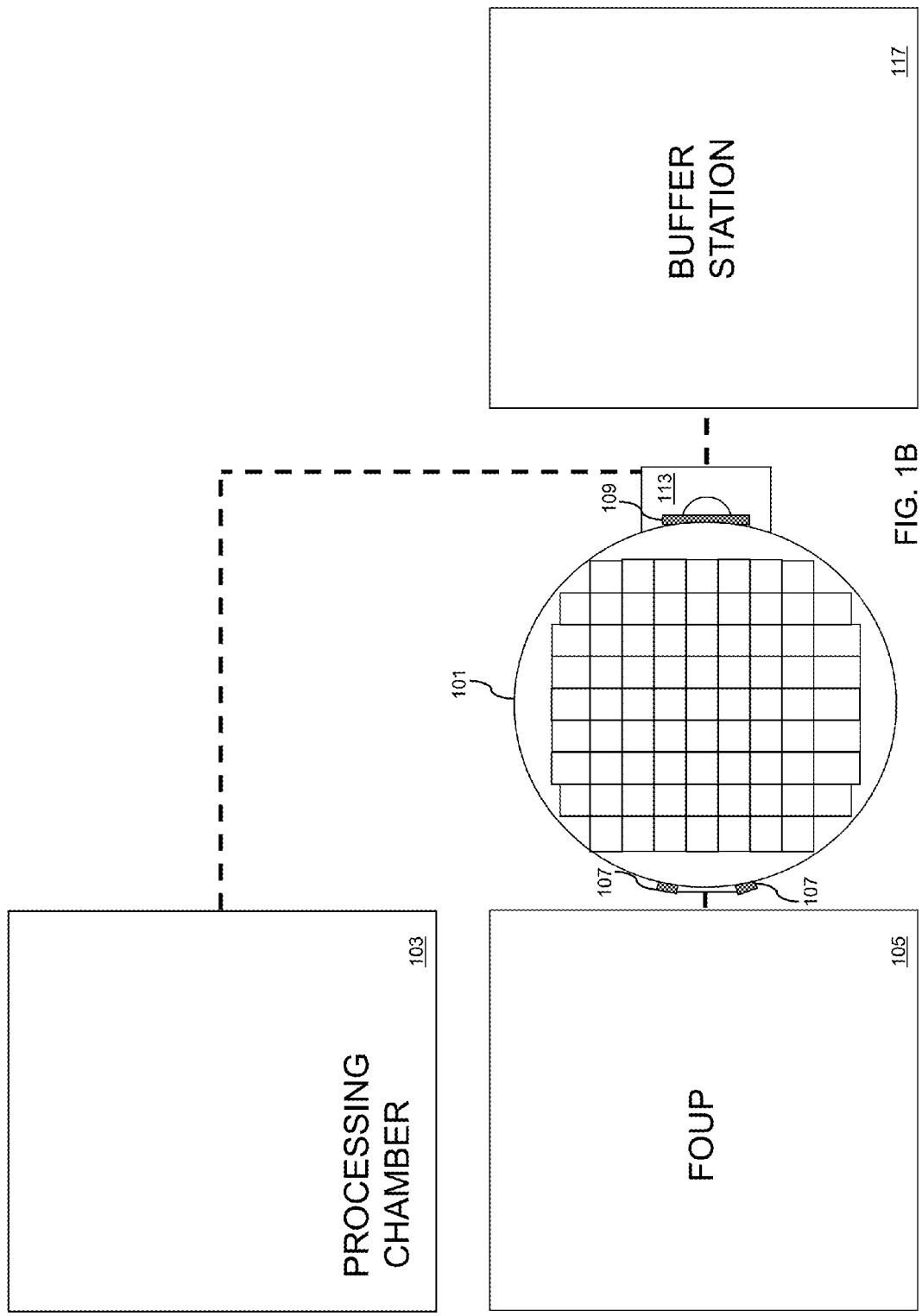

A method in accordance with an exemplary embodiment of the present disclosure is schematically illustrated in FIGS. 1A and 1B. Adverting to FIGS. 1A and 1B, a wafer 101, contained within a final processing chamber 103, e.g., a wet cleaning chamber, of a wafer processing tool, e.g., a CMP tool, (not shown for illustrative purposes), is moved from the processing chamber 103 toward a FOUP 105. The wafer 101 is fixed and/or gripped by grippers 107 and a pin 109 attached to an endeffector 111 that is part of a robot arm 113. The grippers 107 and the pin 109 hold the wafer 101 proximate to the endeffector 111, e.g., 0 to 1 millimeter (mm) above the endeffector 111. In addition, metal structures 115 are formed, for example, of gold, silver, platinum, titanium, or alloys thereof, on the top surface of the endeffector 111. The metal structures may be laminated on the top surface of the endeffector 111, embedded in the top surface, or printed, sputtered, or deposited on the top surface. While FIG. 1A illustrates the metal structures as straight lines, the structures can be implemented in various forms, e.g., spirals, straight lines, zigzags, a series of dots, etc., as depicted in FIGS. 4A through 4D, respectively.

Figure 2:
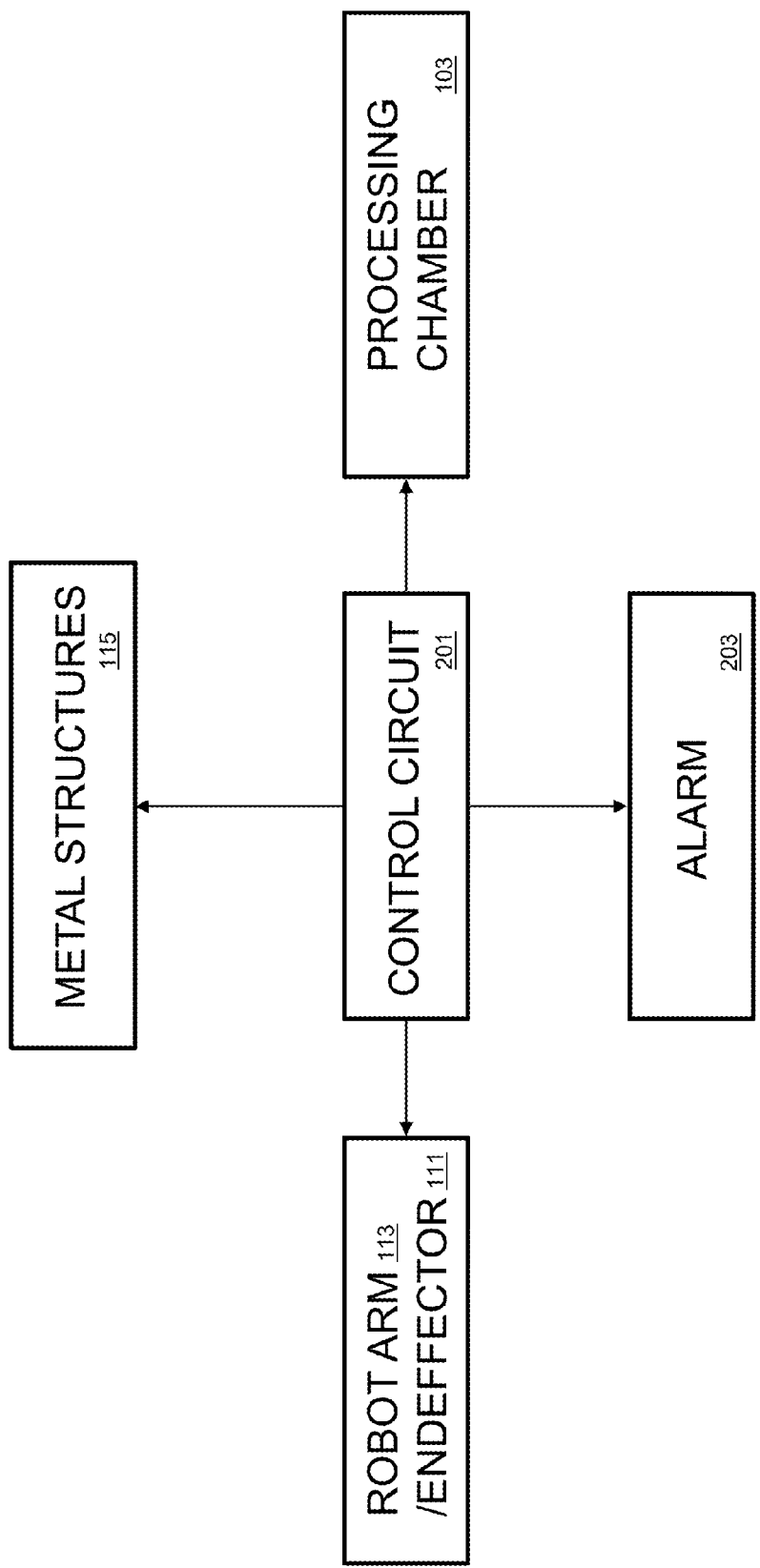
FIG. 2 schematically illustrates the elements controlled by the control circuit, in accordance with an exemplary embodiment of the present disclosure.

Adverting to FIG. 2, a control circuit 201 in accordance with an exemplary embodiment, may be connected to the metal structures 115, the processing chamber 103 of the processing tool (and potentially other processing chambers of the processing tool (not shown for illustrative convenience), an acoustic and/or visual alarm 203, and the robot arm 113 (not shown for illustrative purposes), which includes the endeffector 111. Moisture and/or electrically conductive remains can be instantaneously detected on the back side of wafer 101 by the control circuit 201 by measuring the resistance of the wafer 101, e.g., by subjecting the metal structures 115 to a pulsed or constant voltage, and/or by measuring the capacity and inductance of the wafer 101, e.g., by employing a resonance circuit including the metal structures 115, and comparing the measurements to known values for a corresponding wafer with no moisture or electrically conductive remains. A reduction in the resistance, capacitance, and/or inductance of the wafer 101 from the resistance, capacitance, and/or inducatance, respectively, of the corresponding wafer indicates the presence of moisture and/or electrically conductive remains on the wafer 101. For example, the resistance of the wafer 101 without any humidity typically is in the megaohm (Mohm) range while any humidity on the wafer 101 would reduce the value to the kilohm (kOhm) range. More specifically, if the final drying chamber of the processing tool fails, the wafer 101 backside resistance can be reduced by water, e.g., from the rinse step, or chemicals, e.g., from the bevel etch step. Similarly, the resistance may be reduced by remaining copper (Cu) on the surface of wafer 100, e.g., if the bevel and backside etch process did not function properly.

In accordance with an exemplary embodiment, if the control circuit 201 does not detect moisture and/or electrically conductive remains on the wafer 101, then the control circuit 201 causes the robot arm 113 with the endeffector 111 to transfer the wafer 101 to the FOUP 105. However, if the control circuit 201 detects moisture and/or electrically conductive remains on the wafer 101, then the control circuit causes the robot arm 113 with the endeffector 111 to transfer the wafer 101 to a buffer station 117 to avoid contamination of other wafers in the FOUP. In addition, if the control circuit 201 detects moisture and/or electrically conductive remains on the wafer 101 then the control circuit 201 can cause a disabling of the processing chamber 103 and/or an initiation of an acoustic and/or a visual alarm 203. Moreover, as the wafer 101 is one wafer of a wafer lot (not shown for illustrative purposes), when the wafer lot includes at least one unprocessed wafer or in process wafers, the control circuit 201 can cause any unprocessed or in process wafers to be moved away from the processing tool to a safe harbor position until defects in the tool can be corrected to inhibit the processing chamber 103 from further use by following wafers, inhibit the start of new wafers at the processing tool, and stop delivery of further wafer lots to the processing tool. In addition, if moisture and/or electrically conductive remains are detected on the wafer 101, the endeffector 111 may also be inspected for moisture and/or electrically conductive remains and cleaned before the process is allowed to continue.

A device in accordance with an exemplary embodiment of the present disclosure is schematically illustrated in FIGS. 3A and 3B. Adverting to FIGS. 3A and 3B, an endeffector 111 having a first surface 301 and a second surface 303, opposite the first surface 301, includes holders, e.g., grippers 107 and pin 109, for holding a wafer 101 proximate to, e.g., 0 to 1 mm from, the endeffector 111. The endeffector 111 also includes metal structures 115, formed, for example, of gold, silver, platinum, titanium, or alloys thereof. The metal structures must be able to withstand the process chemicals, e.g., sulfuric acid and chemical blends containing hydrogen peroxide, be conductive, and not contaminate the backside of the wafer 101. The number of metal structures 115 is limited only by the design of the endeffector 111 as well as the required accuracy of the various measurements and, therefore, may range from three to several thousand. The endeffector design and accuracy requirements also determine the spacing and widths of the metal structures 115. For example, to achieve the desired Mohm resistance range in an idle mode, the spacing between and the widths of the metal structures 115 may each range from 5 mm to several microns. The depth of the metal structures 115 depends on the manufacturing process, e.g., lamination, embedding, sputtering, printing, or deposition. Further, the metal structures 115 are connected to a voltage source and a resistance, capacity, and/or inductance sensor, e.g., the control circuit 201.

An apparatus in accordance with an embodiment of the present disclosure is schematically illustrated in FIG. 5. Adverting to FIG. 5, a wafer processing tool (not shown for illustrative purposes), e.g., a CMP processing tool, including a wafer processing chamber 103, e.g., a wafer drying chamber as a final chamber, is connected to a control circuit 201. The control circuit 201 is also connected to a robot arm 113 including an endeffector 111 such as that shown in FIGS. 3A and 3B. The endeffector 111 features a moisture and/or conductive remains detection device formed of metal structures 115 on the first surface of the endeffector 111 connected to a voltage source, which may be provided by the control circuit 201, and a resistance, capacity, and/or inductance sensor, e.g., part of the control circuit 201, connected to the metal structures 115. The control circuit 201 may also be connected to an acoustic and/or visual alarm 203. In addition, the apparatus further includes a buffer station 117 for holding contaminated wafers, a wafer storage unit (not shown for illustrative purposes) for storing unprocessed or in process wafers while one or more chambers of the processing tool are disabled, and a transport device (not shown for illustrative convenience), for transporting unprocessed or in process wafers in the processing tool to the wafer storage device. Further, although a robot (not shown for illustrative purposes) with a single robot arm 113 and a single endeffector 111 is shown in the drawings, some tool platforms may include robots with multiple robot arms 113 with multiple endeffectors 111, respectively. The moisture and/or conductive remains detection device would then control plural wafers simultaneously.

If the control circuit 201 does not detect moisture and/or electrically conductive remains on the wafer 101, the control circuit 201 causes the apparatus to transport wafers, e.g., the wafer 101, one at a time, through the processing tool to final processing chamber 103 and from the processing chamber 103 to the FOUP 105. However, if the control circuit 201 detects moisture and/or electrically conductive remains on a wafer, e.g., the wafer 101, the control circuit 201 causes an initiation of the acoustic and/or visual alarm 203 and causes the apparatus to transport the wet and/or contaminated wafer, e.g., the wafer 101, to an internal buffer station 117. In addition, the control circuit 201 can also cause the apparatus to move all wafers currently in the process to a safe harbor position, inhibit the chamber in question, e.g., the processing chamber 103, from further use by following wafers, disable one or more other chambers of the processing tool, for example inhibit the start of new wafers at the processing tool, e.g., the CMP processing tool, and stop the delivery of further lots to the tool. At this point, the endeffector 111 may also be inspected for the presence of moisture and/or electrically conductive remains.

The embodiments of the present disclosure can achieve several technical effects including instantaneously detecting a misprocessed wafer and containing moisture and/or electrically conductive remains detected on the wafer to that single wafer, while maintaining the ability to rework the wafer, inhibiting subsequent use of the malfunctioning hardware, thereby containing the problem of moisture and/or electrically conductive remains to the single wafer, and preventing the contamination of further tools with wet wafers. The present disclosure enjoys industrial applicability in any of various types of highly integrated semiconductor processes and apparatuses including Cu plating hardware or hardware where wet wafers are handled and/or processed in the tool.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. An apparatus comprising:
   a wafer processing tool including a wafer processing chamber;
   a front opening unified pod (FOUP);
   an endeffector for transporting wafers, one at a time, between the processing chamber and the FOUP;
   a moisture and/or electrically conductive remains detection device connected to the endeffector;
   a buffer station; and
   a circuit, connected to the moisture and/or electrically conductive remains detection device, the endeffector, and the wafer processing chamber, the circuit configured to disable the processing chamber and to instruct the endeffector to deliver a wafer thereon to the buffer station, if the moisture and/or electrically conductive remains detection device detects moisture and/or conductive remains.

2. The apparatus according to claim 1, further comprising:
   an acoustic and/or visual alarm connected to the circuit, wherein the circuit is further configured to trigger the alarm if the moisture and/or conductive remains detection device detects moisture and/or electrically conductive remains.

3. The apparatus according to claim 1, further comprising:
   a wafer storage unit and a transport device for transporting wafers in the processing tool to the wafer storage device if the moisture and/or electrically conductive remains detection device detects moisture and/or electrically conductive remains.

4. The apparatus according to claim 1, wherein the wafer processing chamber comprises a wafer drying chamber.

5. The apparatus according to claim 1, wherein the endeffector has a first surface and a second surface opposite the first surface and includes means for holding a wafer proximate to the first surface.

6. The apparatus according to claim 5, wherein the moisture and/or electrically conductive remains detection device comprises:
   metal structures on the first surface of the endeffector connected to a voltage source; and
   a resistance, capacity, and/or inductance sensor connected to the metal structures.

7. An apparatus comprising:
   a wafer processing tool including a wafer processing chamber;
   a front opening unified pod (FOUP);
   an endeffector for transporting a wafer between the processing chamber and the FOUP, the endeffector having a first surface and a second surface, opposite the first surface, the endeffector including grippers and a pin for holding the wafer proximate to the first surface;
   a moisture and/or electrically conductive remains detection device connected to the endeffector;
   a buffer station; and
   a circuit, connected to the moisture and/or electrically conductive remains detection device, the endeffector, and the wafer processing chamber, the circuit configured to disable the processing chamber and to instruct the endeffector to deliver the wafer thereon to the buffer station, if the moisture and/or electrically conductive remains detection device detects moisture and/or conductive remains.

8. The apparatus according to claim 7, further comprising:
   an acoustic and/or visual alarm connected to the circuit, wherein the circuit is further configured to trigger the alarm if the moisture and/or conductive remains detection device detects moisture and/or electrically conductive remains.

9. The apparatus according to claim 7, further comprising:
   a wafer storage unit and a transport device for transporting wafers in the processing tool to the wafer storage device if the moisture and/or electrically conductive remains detection device detects moisture and/or electrically conductive remains.

10. The apparatus according to claim 7, wherein the wafer processing chamber comprises a wafer drying chamber.

11. The apparatus according to claim 7, wherein the first surface is opposite the second surface.

12. The apparatus according to claim 11, wherein the moisture and/or electrically conductive remains detection device comprises:
    metal structures on the first surface of the endeffector connected to a voltage source; and
    a resistance, capacity, and/or inductance sensor connected to the metal structures.

13. The apparatus according to claim 12, wherein:
    the metal structures are sputtered, printed, or deposited on the first surface of the endeffector, and
    the metal structures are resistant against sulfuric acid and chemical blends containing hydrogen peroxide.

14. The apparatus according to claim 12, wherein the metal structures comprise gold, silver, platinum, titanium, or alloys thereof.

* * * * *